(12) United States Patent
Wuu et al.

(10) Patent No.: US 7,133,319 B2
(45) Date of Patent: Nov. 7, 2006

(54) PROGRAMMABLE WEAK WRITE TEST MODE (PWWTM) BIAS GENERATION HAVING LOGIC HIGH OUTPUT DEFAULT MODE

(75) Inventors: John Wuu, Fort Collins, CO (US); Blaine Stackhouse, Fort Collins, CO (US); Donald R. Weiss, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 476 days.

(21) Appl. No.: 10/600,878

(22) Filed: Jun. 20, 2003

(65) Prior Publication Data

US 2004/0260986 A1    Dec. 23, 2004

(51) Int. Cl.
  *G11C 7/00*    (2006.01)
(52) U.S. Cl. ............... 365/201; 365/189.09; 365/154
(58) Field of Classification Search ............ 365/201, 365/189.09, 154
  See application file for complete search history.

(56) References Cited

U.S. PATENT DOCUMENTS 6,256,241 B1    7/2001  Mehalel
6,501,692 B1   12/2002  Melanson et al.
6,735,131 B1 *  5/2004  Vangal ................. 365/201
6,778,450 B1 *  8/2004  Selvin et al. .......... 365/201

OTHER PUBLICATIONS

Sanjay Sengupta et al., "Defect-Based Test: A Key Enabler for Successful Migration to Structural Test," Intel Technology Journal, Q1, 1999, pp. 1-14.

* cited by examiner

*Primary Examiner*—Huan Hoang

(57) ABSTRACT

The present invention employs a bias voltage having a selectable magnitude to bias a weak write pull-down transistor in a write driver of a static random access memory (SRAM) array. A programmable weak write test mode (PWWTM) bias generator includes an output signal that is a logic high in a default mode when a WWTM is not active. When the WWTM is active, the generator output signal is the bias voltage having the selectable magnitude. The default mode logic high is actively maintained when the generator output is connected to a load, such as the write driver of the SRAM array. A WWTM-enabled SRAM system includes the PWWTM bias generator. A method of driving a WWTM-equipped SRAM includes generating and applying the output signal to a gate of a weak write pull-down transistor of the SRAM array write driver in the default mode and the WWTM.

24 Claims, 4 Drawing Sheets

PROGRAMMABLE WEAK WRITE TEST MODE (PWWTM) BIAS GENERATION HAVING LOGIC HIGH OUTPUT DEFAULT MODE

TECHNICAL FIELD

The invention relates to integrated circuits (IC). In particular, the invention relates to built-in self-test (BIST) used with static random access memory (SRAM).

BACKGROUND OF THE INVENTION

Among the typical tests that are performed on SRAM arrays are tests for memory cell data retention faults (DRFs) and memory cell stability faults. In particular, DRFs and stability faults often result from variations in manufacturing materials and processes. In the past, DRF and stability fault testing has been largely functional in nature. Namely, a read/write algorithm is developed that functionally exercises the SRAM. The read/write algorithm is then executed by a memory test system external to the IC. From the results of the functional testing, an attempt is made to deduce DRFs and stability faults for individual memory cells in the SRAM.

Recently, several test methodologies have been developed that directly test for such failures instead of inferring the failures from functional tests. Moreover, some of these test methodologies are well-suited to being implemented as a built-in self-test (BIST), such that the cost and time associated with testing for DRF and stability faults using an external memory test system are reduced or effectively eliminated. One such methodology known as Weak Write Test Mode (WWTM) is disclosed by Banik et al., U.S. Pat. No. 5,559,745, incorporated herein by reference.

When testing an SRAM with WWTM, an attempt is made to overwrite a data value stored in a memory cell using a "weak" write value or signal. The weak write signal is only capable of overwriting the stored value in the memory cell if the memory cell is unstable or defective. Thus, if the weak write test is successful, a defect in the memory cell is indicated. An unsuccessful weak write test indicates a healthy memory cell, at least with respect to stability and DRFs.

Weiss et al., U.S. Pat. No. 6,192,001 B1, incorporated herein by reference, disclose a WWTM approach that integrates a weak write driver functionality into an existing conventional column-associated write driver of the SRAM. According to Weiss et al., only two additional transistors are added to each conventional write driver in each set of columns as opposed to six transistors per column according to Banik et al. A set of columns is one or more columns depending on whether or not column multiplexing is employed in the SRAM. In particular, a first or weak write pull-down transistor is added that modifies a level of an output signal of the write driver when in WWTM and a second or bypass pull-down transistor is added that essentially bypasses the first transistor thereby facilitating a normal or strong write output signal to be produced by the write driver when not in WWTM.

Unfortunately, sizing of the weak write pull-down transistor of Weiss et al. presents certain practical difficulties in IC manufacturing. In particular, the weak write pull-down transistor must be big or strong enough to insure that the WWTM write driver output signal adequately exercises the memory cells of the SRAM, allowing for reliable detection of defective memory cells. Simultaneously, the weak write pull-down transistor must be small or weak enough such that the WWTM write driver output signal is not capable of overwriting data in healthy memory cells thereby producing false detection of defects.

In practice, the weak write pull-down transistor sizing is sensitive to variables and tolerances of a given manufacturing line and/or inadequacies of a design simulation to account for such variables and tolerances. Thus, many memory design and prototype iterations may be necessary to produce a properly sized weak write pull-down transistor. Moreover, each time the IC design is changed and/or the manufacturing process/line is changed or modified, the iterative design process typically must be repeated.

Accordingly, it would be advantageous to have a way to implement WWTM that was less sensitive to weak write pull-down transistor sizing. In addition, it would be advantageous if such implementations did not appreciably increase the number of transistors in the SRAM array or a number of traces in the SRAM IC used to access and activate WWTM. Such an implementation of WWTM would solve a long-standing need in the area of BIST for ICs that contain SRAM arrays.

SUMMARY OF THE INVENTION

The present invention provides a weak write test mode (WWTM) for static random access memory (SRAM). In particular, the present invention generates and employs a bias voltage having a selectable magnitude to bias a weak write pull-down transistor in a write driver of an SRAM.

In one aspect of the invention, a programmable weak write test mode (PWWTM) bias generator is provided. The PWWTM bias generator comprises means for generating an output signal that is a logic high level at an output of the PWWTM generator in a default mode when a WWTM is not asserted or not active. The output signal is a bias voltage signal having a selectable or programmable magnitude at the output when the WWTM is asserted.

In some embodiments, the PWWTM bias generator comprises an array of transistors connected in parallel between a first supply voltage and an output of the PWWTM bias generator. Each of the array transistors of the array is individually selectable and by selecting may be individually activated. The PWWTM bias generator further comprises a pull-down transistor connected between the PWWTM bias generator output and a second supply voltage. The PWWTM bias generator further comprises a gate bias circuit connected between a mode select input and a gate of the pull-down transistor. The gate bias circuit biases the pull-down transistor. Selecting and activating a particular one or more of the array transistors from the array selects a particular magnitude of the bias voltage at the PWWTM bias generator output.

The PWWTM bias generator generates an output signal or a bias voltage that is used to bias a gate of the weak write pull-down transistor of the SRAM array write driver when WWTM is asserted or active. A magnitude of the bias voltage controls an 'activated' strength of the weak write pull-down transistor that affects a WWTM output or drive level generated by the write driver. Thus, the PWWTM bias generator, through a set of selection inputs, controls the WWTM output level of the SRAM write driver during WWTM testing of the SRAM. Moreover, a default output level of the PWWTM bias generator, when the WWTM is not active, is a logic 'high' level or value, such that the weak write pull-down transistor is biased to an ON state. Furthermore, a single PWWTM bias generator may be used to control a plurality of weak write pull-down transistors in a plurality of write drivers of the SRAM.

In another aspect of the invention, a weak write test mode (WWTM)-enabled SRAM system is provided. In yet another aspect of the invention, a method of driving a WWTM-equipped SRAM using a bias voltage output signal with a high logic level default mode is provided.

Certain embodiments of the present invention have other advantages in addition to and in lieu of the advantages described hereinabove. These and other features and advantages of the invention are detailed below with reference to the following drawings.

BRIEF DESCRIPTION OF THE DRAWINGS

The various features and advantages of the present invention may be more readily understood with reference to the following detailed description taken in conjunction with the accompanying drawings, where like reference numerals designate like structural elements, and in which.

MODES FOR CARRYING OUT THE INVENTION

Figure 1:
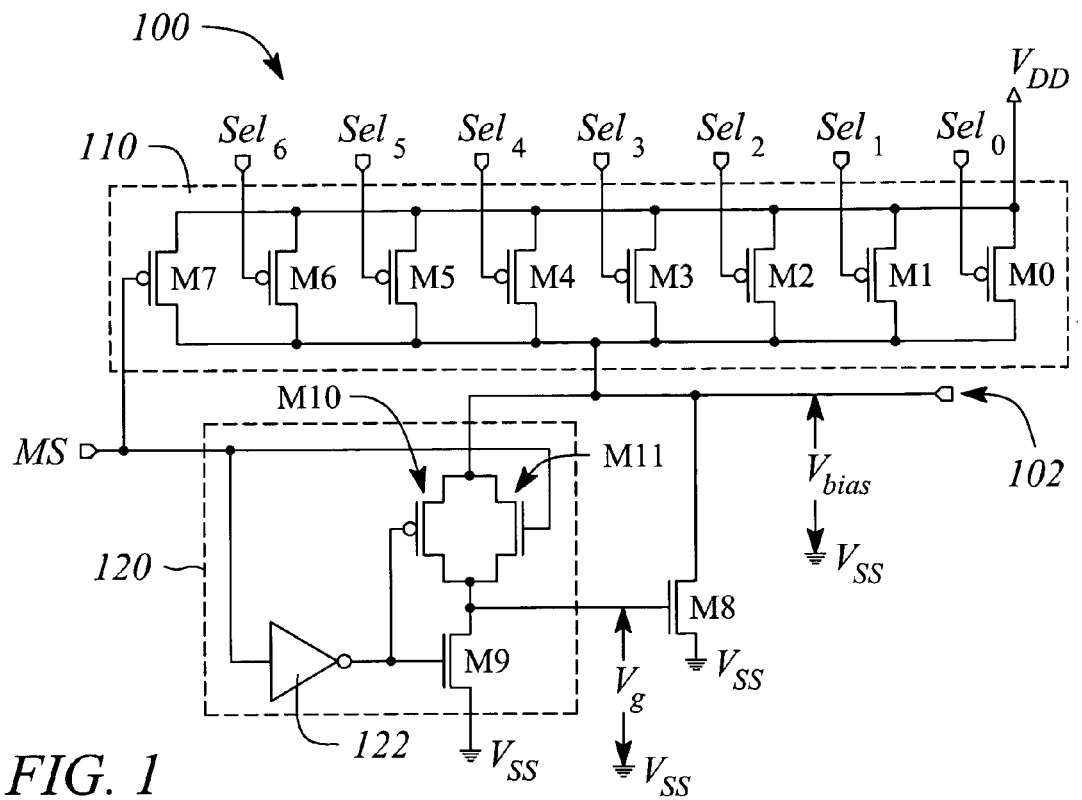
FIG. 1 illustrates a block diagram of a programmable weak write test mode (PWWTM) bias generator according to an embodiment of the present invention.

FIG. 1 illustrates a block diagram of a programmable weak write test mode (PWWTM) bias generator 100 according to an embodiment of the present invention. The PWWTM bias generator 100 has two operational modes. A first operational mode corresponds to a weak write test mode (WWTM) of an associated static random access memory (SRAM) while a second mode corresponds to a normal read/write operational mode of the SRAM. In other words, when the WWTM is activated or asserted, the PWWTM bias generator 100 operates in the first mode or WWTM. Otherwise, the PWWTM bias generator 100 operates in a second mode or 'not WWTM'. The second mode is also referred to herein as a 'default' mode. A mode select MS input of the PWWTM bias generator 100 controls a selection between the WWTM and the default mode.

When the operational mode is WWTM, the PWWTM bias generator 100 produces an output signal or a bias voltage $V_{bias}$ having a programmable or selectable magnitude. The bias voltage $V_{bias}$ is produced at an output 102 of the bias generator 100. The selectable magnitude of the bias voltage $V_{bias}$ may take on values between a voltage value of a first supply voltage $V_{DD}$ and a voltage value of a second supply voltage $V_{SS}$ that is lower than the first supply voltage $V_{DD}$ (i.e., $V_{SS} < V_{DD}$). Preferably, the second supply voltage $V_{SS}$ is essentially zero volts (i.e., $V_{SS} \approx 0$ V) and is a ground potential or voltage of PWWTM bias generator 100. The selectable magnitude of the bias voltage $V_{bias}$ in the WWTM is controlled by a set of selection inputs $Sel_i$ of the PWWTM bias generator 100.

When the operational mode is the default mode or 'not WWTM', the output signal produced at the PWWTM bias generator output 102 defaults to a voltage level that represents a logic high or '1' for the SRAM. Preferably, the default logic high of the output signal is approximately equal to the first supply voltage $V_{DD}$. Furthermore, the PWWTM bias generator 100 is capable of actively maintaining the default logic high level of the output signal while in the default mode when the output 102 is connected to a load.

The PWWTM bias generator 100 comprises an array 110 of p-type or p-channel metal oxide semiconductor (PMOS) transistors M0–M7. As illustrated in FIG. 1, the exemplary array 110 comprises eight PMOS transistors M0–M7 for discussion purposes only. Any number of PMOS transistors may be employed in the array 110 and still be within the scope of the present invention.

The transistors M0–M7 of the array 110 are connected between the first supply voltage $V_{DD}$ and the output 102 of the PWWTM bias generator 100. In particular, as illustrated in the exemplary embodiment of FIG. 1, each of the array transistors M0–M7 of the array 110 has a source connected to the first supply voltage $V_{DD}$ and a drain connected to the output 102 of the PWWTM bias generator 100.

The set of selection inputs $Sel_i$ are connected to all array transistors M0–M6 but a last array transistor M7 of the array 110. Specifically, a gate of each array transistors M0–M6 is connected to a different one of the selection inputs $Sel_i$ of the set except for the last array transistor M7. In other words, a first selection input $Sel_0$ is connected to a gate of a first transistor M0 of the array 110. A second selection input $Sel_1$ is connected to a gate of a second transistor M1 of the array 110, and so on. A gate of the last array transistor M7 is connected to the mode select MS input of the PWWTM bias generator 100.

The set of selection inputs $Sel_i$ control activation of the array transistors M0–M6. In particular, the individual selection inputs $Sel_i$ control which of the array transistors M0–M6 are active, 'turned ON' or placed in an ON state, and which are inactive, 'turned OFF' or placed in an OFF state. Similarly, the mode select MS input controls whether or not the eighth or last array transistor M7 is turned ON. When turned ON, a metal oxide semiconductor (MOS) transistor approximates a resistor and a current $I_{ds}$ may flow through the MOS transistor. When turned OFF, the MOS transistor approximates an open circuit. Thus, when activated by asserting one or more of the selection inputs $Sel_i$ of the set and/or the mode select MS input, the array 110 conducts current from the first supply voltage $V_{DD}$ and acts to 'pull-up' the bias voltage $V_{bias}$ toward a level of the first supply voltage $V_{DD}$. For example, asserting the second selection input $Sel_1$ by applying a logic low '0' (i.e., $Sel_1=0$ V) turns ON the second transistor M1 of the array 110. The second transistor M1 then pulls-up the bias voltage $V_{bias}$. Similarly, the eighth transistor M7 acts to pull up the bias voltage $V_{bias}$ when WWTM is not asserted by way of the mode select MS input (i.e., MS='0'). As such, each of the transistors M0–M7 of the array 110 is a 'pull-up' transistor.

In some embodiments of the PWWTM bias generator 100, each of the array transistors Mi is a different size from one another. For example, the first array transistor M0 may be smaller than the second array transistor M1. Likewise, the second array transistor M1 may be smaller than a third transistor M2 of the array 110, and so on. Preferably, the eighth array transistor M7 (or the last array transistor, for example) is larger than the other transistors M0–M6 of the array 110.

As used herein, transistor size generally relates to an effective resistance of an active or turned ON transistor. In particular, for a given metal oxide semiconductor (MOS) manufacturing process, size is essentially an inverse function of a ratio between a gate width or transistor width and a gate length or transistor length. Thus, for a given length, a greater width produces a lower effective resistance when the MOS transistor is turned ON.

Related to the transistor size is a transistor strength. Transistor strength is typically associated with a current sourcing or sinking capacity of the transistor. For example, a stronger transistor can source more current than a weaker transistor. However, as used herein, transistor strength and transistor size are used essentially interchangeably. Specifically, a larger transistor is a stronger transistor. However, while transistor strength is related to transistor size, a bias voltage applied to a gate of the transistor can also affect transistor strength. In particular, a bias voltage having a level between a level that turns ON the transistor and a level that turns OFF the transistor may be employed to modulate the transistor strength. One skilled in the art is familiar with transistor size and transistor strength and the relationship between size/strength and the ON state resistance of the transistor. In particular, one skilled in the art may readily determine appropriate sizes/strengths of any and all of the MOS transistors used in the PWWTM bias generator 100 without undue experimentation.

In other exemplary embodiments, each of the PMOS transistors Mi of the array 110 are essentially the same size as one another. In such embodiments, the mode select MS input may be combined with the selection inputs $Sel_i$, such that when WWTM is asserted on the mode select MS input, the selection inputs $Sel_i$ may be individually and independently asserted. Alternatively, when WWTM is not asserted on the mode select MS input, all of the transistors M0–M7 of the array 110 preferably are turned ON to cooperatively pull up the bias voltage $V_{bias}$. Thus, in the example having array transistors M0–M7 of the same size, no particular or single array transistor functions as the pull-up transistor when in the default mode. Instead, all of the transistors M0–M7 of the array 110 act together to pull-up the bias voltage $V_{bias}$ to the logic high '1' level.

Moreover in some embodiments, one or more of the transistors Mi of the array 110 may actually represent a plurality of PMOS transistors connected in one or more of a series and a parallel configuration. For example, the first PMOS transistor M0 may comprises a pair of PMOS transistors (not illustrated) connected in series and acting as a single transistor with respect to the first selection input $Sel_0$.

The PWWTM bias generator 100 further comprises an n-type or n-channel metal oxide semiconductor (NMOS) transistor M8. The transistor M8 is preferably a weak transistor. The transistor M8 is connected between the output 102 of the PWWTM bias generator 100 and the second supply voltage $V_{SS}$. In particular, a drain of the transistor M8 is connected to the output 102 and a source of the transistor M8 is connected to the second supply voltage $V_{SS}$.

A gate voltage $V_g$ generally greater than zero volts applied to a gate of the transistor M8 activates or turns ON the transistor M8. In particular, a high level or logic "1" applied to the gate turns ON the transistor M8. When turned ON, the transistor M8 conducts a current $I_{ds}$ from the output 102 to the second supply voltage $V_{SS}$ or ground. Furthermore, the gate voltage $V_g$ equal to approximately zero volts ($V_g$=0 V) turns OFF the transistor M8. The effect of turning ON the transistor M8 is to 'pull-down' the bias voltage $V_{bias}$ toward the second supply voltage $V_{SS}$ or ground potential. Thus, the transistor M8 is a pull-down transistor, preferably a weak pull-down transistor, when active or turned ON.

The gate voltage $V_g$ is related to the operational mode asserted using the mode select MS input. In particular, when WWTM is asserted on the mode select MS input, a positive (non-zero) gate voltage $V_g$ is preferably applied to the transistor M8 gate. Likewise, when WWTM is not asserted on the mode select MS input, a logic low '0' is preferably applied to the transistor M8 gate. Thus for example, the gate of the pull-down transistor M8 may be directly connected to and driven by the mode select MS input. Preferably however, the PWWTM bias generator 100 further comprises a gate bias circuit 120 connected between the mode select MS input and the gate of the pull-down transistor M8.

As illustrated in the exemplary embodiment of FIG. 1, the gate bias circuit 120 of the PWWTM bias generator 100 comprises an NMOS transistor M9 connected between the NMOS transistor M8 gate and the second supply voltage $V_{SS}$ that functions as a pull-down transistor. The gate bias circuit 120 further comprises a PMOS transistor M10 and an NMOS transistor M11 connected between the output 102 and the gate of the pull-down transistor M8. Together, the transistors M10 and M11 operate as a conventional transmission gate. The gate bias circuit 120 further comprises an inverter 122, an output of which is connected to a gate of the PMOS transistor M10 and a gate of the NMOS transistor M9. A gate of the NMOS transistor M11 and an input of the inverter 122 are connected to the mode select MS input of the PWWTM bias generator 100.

When WWTM is asserted (i.e., MS='1'), the inverter 122 produces a logic '0' output signal and the transistor M11 is turned ON. The logic '0' signal turns OFF the transistor M9 and turns ON the transistor M10. As noted hereinabove, the combination of the transistors M11 and M10 is essentially a transmission gate known in the art. Thus, when both transistors M10, M11 are turned ON, the gate voltage $V_g$ on the gate of the transistor M8 becomes approximately equal to the bias voltage $V_{bias}$. With the bias voltage $V_{bias}$ essentially applied to the gate of the transistor M8, the transistor M8 is turned ON.

Also mentioned hereinabove, when WWTM is asserted (i.e., MS='1'), the array transistor M7 is turned OFF. Assuming at least one of the array transistors M0–M6 are selected (i.e., one of $Sel_i$='0' for i=0, . . . , 6), current flows from the supply voltage $V_{DD}$ through the array 110 and to the output 102. Simultaneously, current flows from the output 102 through the pull-down transistor M8 to the supply voltage or ground $V_{SS}$. The combination of the pull-up action of the array 110 and the pull-down action of the transistor M8 establish the selectable magnitude of the bias voltage $V_{bias}$. In essence, the array 110 in combination with the activated pull-down transistor M8 approximates a voltage divider circuit. Moreover, a division factor of the divider circuit is set by a ratio between an effective resistance of the activated pull-down transistor M8 and an effective resistance of selected one or more of the array transistors M0–M6 of the array 110. In other words, a ratio between a size of the weak pull-down transistor M8 and an effective size of the activated transistors M0–M6 of the array 110 establishes the magnitude of the bias voltage $V_{bias}$. The effective size of the active array transistors M0–M6 is a sum of the sizes of one or more of the selected array transistors M0–M6. As described hereinabove, an array transistor M0–M6 is selected by applying a logic '0' to one or more of the corresponding selection inputs Sel$_i$ of the PWWTM bias generator 100. Thus, by selecting an appropriate one or more of the array transistors M0–M6, the division factor is selected, and by selecting the division factor, the magnitude of the output signal or the bias voltage V$_{bias}$ is selected.

For example, if each of the array transistors M0–M6 has a different unique size, then individually selecting one of the array transistors M0–M6 enables any one of seven different magnitudes of the bias voltage V$_{bias}$ to be selected. Additional bias voltage V$_{bias}$ magnitudes may be selected by selecting combinations of the array transistors M0–M6. Changing a size difference between a smallest transistor in the array 110 and a largest transistor in the array 110 may adjust an extent of a range of selectable magnitudes. A median bias voltage V$_{bias}$ magnitude may be adjusted by adjusting a relative size of the pull-down transistor M8 with respect to a median size of the transistors M0–M6 of the array 110. One skilled in the art will readily recognize that the relative size of the transistors M0–M6 and M8 may be adjusted by adjusting one or both of an actual size of the pull-down transistor M8 and an actual median size of the array transistors M0–M6. Moreover, one skilled in the art may readily determine the relative and actual sizes of the array transistors M0–M6 and the pull-down transistor M8 to produce any desired set of selectable bias voltage V$_{bias}$ magnitudes without undue experimentation.

When WWTM is not asserted (i.e., MS='0'), the PWWTM bias generator 100 is placed in the default mode. In the default mode, the inverter 122 produces a logic '1' output signal and the transistor M11 is turned OFF. The logic '1' output signal of the inverter 122 turns ON the transistor M9 and turns OFF the transistor M10. With both transistors M10 and M11 turned OFF, the transmission gate formed by transistors M10 and M11 is turned OFF. The transistor M9 turned ON and the transmission gate turned OFF causes the gate voltage V$_g$ on the gate of the pull-down transistor M8 to be pulled down to approximately the second supply voltage V$_{SS}$ or to approximately ground potential. As a result, the pull-down transistor M8 is turned OFF. Furthermore, since WWTM is not asserted, a logic '0' is applied to the gate of the eighth or last transistor M7 of the array 110 and the eighth or last transistor M7 is turned ON. With the eighth/last transistor M7 turned ON and the pull-down transistor M8 turned OFF, current flowing through the activated eighth/last transistor M7 pulls up the bias voltage V$_{bias}$ to approximately the first supply voltage V$_{DD}$. Thus advantageously, the produced output signal of the PWWTM bias generator 100 illustrated in FIG. 1 defaults to a logic high '1' when WWTM is not asserted.

Figure 2:
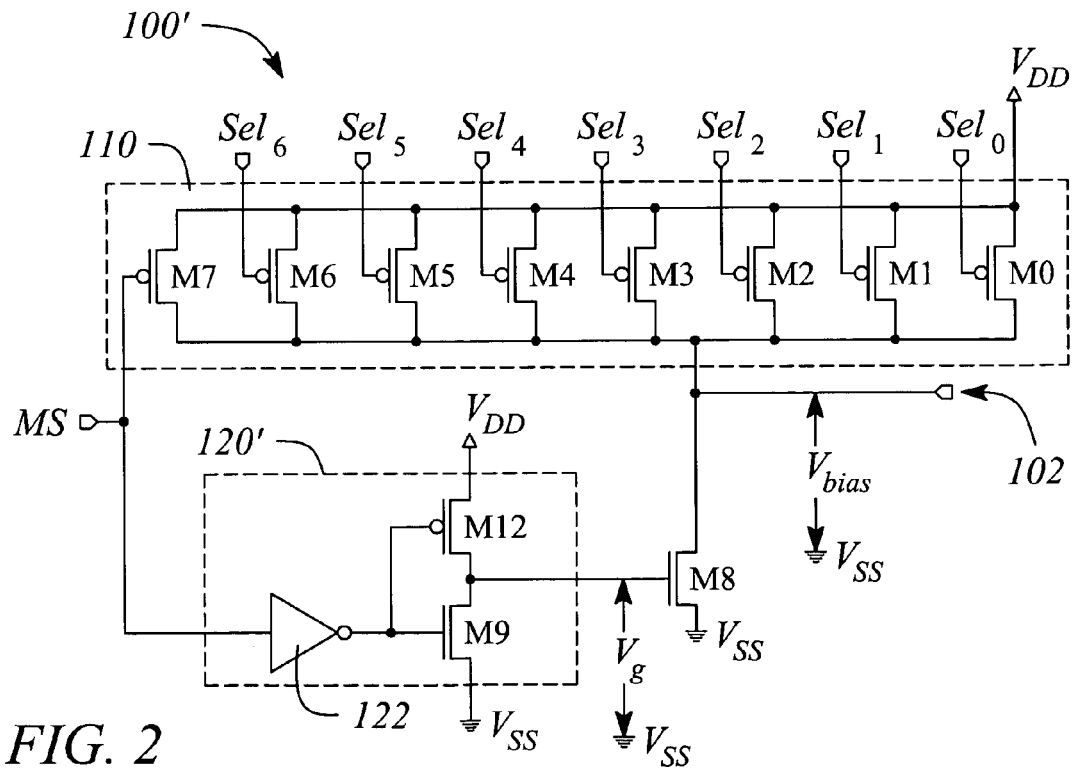
FIG. 2 illustrates a block diagram of another embodiment of a programmable weak write test mode (PWWTM) bias generator according to the present invention.

FIG. 2 illustrates another embodiment of a programmable weak write test mode (PWWTM) bias generator 100' according to the present invention. The PWWTM bias generator 100' is similar to the PWWTM bias generator 100. In particular, the PWWTM bias generator 100' comprises the array 110 and the pull-down transistor M8. Furthermore, the PWWTM bias generator 100' produces an output signal or a bias voltage V$_{bias}$ when WWTM is asserted at the mode select MS input and the output signal defaults to a logic high '1' voltage level when WWTM is not asserted as the mode select MS input. The PWWTM bias generator 100' differs from the previously described PWWTM bias generator 100 essentially in that another, somewhat simpler, gate bias circuit 120' is employed in place of the gate bias circuit 120 described hereinabove.

The gate bias circuit 120' comprises the inverter 122 and the pull-down transistor M9 connected as described hereinabove with respect to the gate bias circuit 120. The simpler gate bias circuit 120' further comprises a pull-up transistor M12 connected between the supply voltage V$_{DD}$ and the gate of the pull-down transistor M8. A gate of the pull-up transistor M12 is connected to the output of the inverter 122. Omitted from the gate bias circuit 120' are the transistor M10 and the transistor M11 that formed the transmission gate of the gate bias circuit 120.

The gate bias circuit 120' operates to drive the pull-down transistor M8 in a manner that is essentially similar to that previously described hereinabove. In particular, when WWTM is asserted, the inverter 122 produces a logic low '0' output signal. The logic low '0' output signal turns OFF the pull-down transistor M9 and turns ON the pull-up transistor M12. The gate voltage V$_g$ is pulled up to the supply voltage V$_{DD}$ and the transistor M8 is turned ON. Alternatively, when WWTM is not asserted, the inverter 122 produces a logic high '1' output signal. The logic high '1' output signal turns ON the pull-down transistor M9 and turns OFF the pull-up transistor M12. The gate voltage V$_g$ is pulled down to the second supply voltage V$_{SS}$ or ground and the transistor M8 is turned OFF.

One skilled in the art may readily devise other variations of the gate bias circuit all of which are within the scope of the present invention. For example, a gate bias circuit may be implemented as a single non-inverting driver (not illustrated) connected between the mode select MS input and the gate of the pull-down transistor M8. In yet another embodiment as noted hereinabove, a gate bias circuit may be essentially omitted entirely by connecting the mode select MS input directly to the gate of the pull-down transistor M8. Other variations of the PWWTM bias generator 100, 100' within the scope of the present invention include, but are not limited to, using an array of individually selectable transistors (not illustrated) in place of or in addition to the pull-down transistor M8.

Figure 3A:
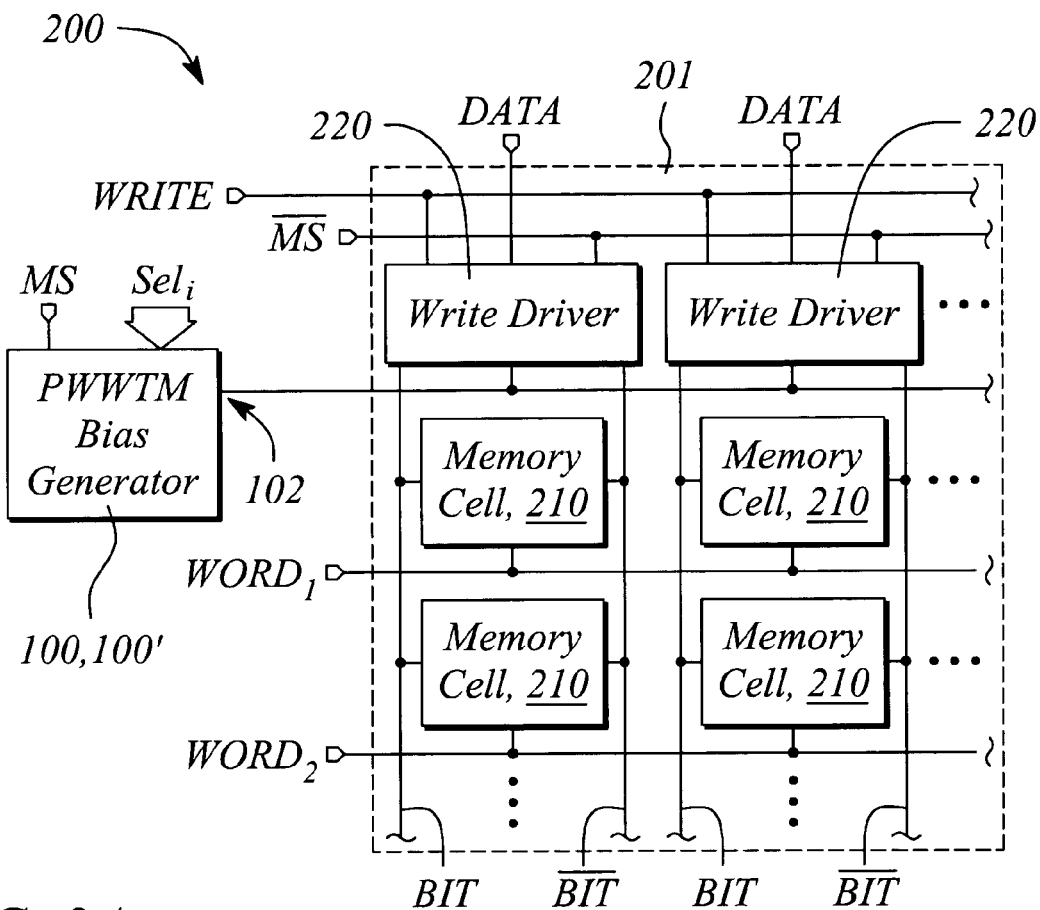
FIG. 3A illustrates a block diagram of an exemplary weak write test mode (WWTM)-enabled SRAM system according to an embodiment of the present invention.

According to the present invention, the PWWTM bias generator 100, 100' provides the output signal or the bias voltage V$_{bias}$ to a static random access memory (SRAM) having a weak write test mode configuration. FIG. 3A illustrates a block diagram of an exemplary weak write test mode (WWTM)-enabled SRAM system 200 according to an embodiment of the present invention. The WWTM-enabled SRAM 200 comprises a WWTM-configured SRAM array 201 and the PWWTM bias generator 100, 100'. The WWTM-configured SRAM array 201 comprises a plurality of memory cells 210 arranged in columns and a plurality of write drivers 220, each write driver 220 driving one or more of the columns. The SRAM array 201 has a WRITE input, an inverse mode select $\overline{MS}$ input, a set of WORD inputs, and a set of DATA inputs. Both the WRITE input and the inverse mode select $\overline{MS}$ input are connected to each write driver 220 of the plurality at respective inputs thereof. Each write driver 220 connects to a different DATA input of the set of DATA inputs. The output 102 of the PWWTM bias generator 100, 100' connects to a corresponding analog weak write test mode (AWWTM) input of each of the write drivers 220.

Each write driver 220 connects to the memory cells 210 in the associated column through a BIT line and an inverse $\overline{BIT}$ line. Each memory cell 210 in the column connects to a different WORD input of the set. The WORD inputs are sometimes referred to as 'row selects' given the association between the WORD inputs and rows of memory cells 210 in the SRAM array 201. The inverse mode select $\overline{MS}$ input controls whether or not the write driver 220 operates in weak write test mode (WWTM) when writing data to a selected memory cell 210 in the column.

To write data to an individual memory cell 210, a corresponding WORD input is asserted (e.g., WORD='1'). Assertion of the WORD input enables a connection within the memory cell 210 between the memory cell 210 and the BIT and $\overline{BIT}$ lines of the column. The write driver 220 then drives the BIT and $\overline{BIT}$ lines with the data from the connected DATA input.

For example, when the WWTM is not asserted (i.e., MS='0', or $\overline{MS}$='1'), the write driver 220 performs a strong write to the selected memory cell 210. The term 'strong write' is a term of art that is relative to another term of art 'weak write', which is described further below. Thus, if the data on the DATA input is a '1', the write driver 220 produces a logic high '1' on the BIT line and a logic low '0' on the inverse $\overline{BIT}$ line. Conversely, if the data on the DATA input is a '0', the write driver 220 produces a logic low '0' on the BIT line and a logic high '1' on the inverse $\overline{BIT}$ line. When presented with the strong write, the selected memory cell 210 latches the data encoded by the BIT and $\overline{BIT}$ lines, overwriting a previous state of the memory cell 210.

In another example, when the WWTM is asserted (i.e., MS='1', or $\overline{MS}$='0'), the write driver 220 performs a weak write to the selected memory cell 210, as opposed to the 'strong write' mentioned above. As described in Banik et al., a weak write consists of writing to a memory cell 210 using an abnormal signal level or value. Typically, the abnormal signal level is a signal level that deviates from or falls short of a normal signal level. Thus, if the data on the DATA input is a '1', the write driver 220 produces a voltage level on the BIT line somewhat below a normal logic '1' voltage level. At the same time, the write driver 220 produces a voltage level on the inverse $\overline{BIT}$ line that is somewhat above a normal logic '0'. According to the WWTM methodology, if the abnormal signal levels produced by the write driver 220 are capable of causing the selected memory cell 210 to change state (e.g., overwrite a '0' with a '1'), then the memory cell 210 is considered defective.

Figure 3B:
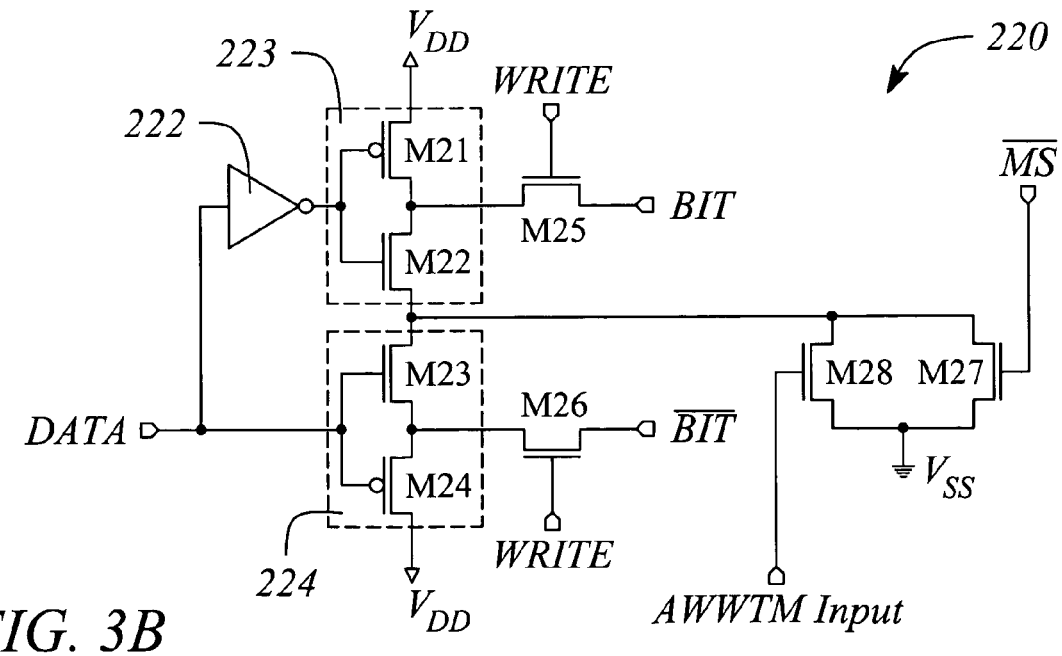
FIG. 3B illustrates a block diagram of an exemplary WWTM-configured write driver according to an embodiment of the present invention.

FIG. 3B illustrates a block diagram of an exemplary WWTM-configured write driver 220 according to an embodiment of the present invention. The WWTM-configured write driver 220 illustrated in FIG. 3B is based on the integrated WWTM SRAM disclosed by Weiss et al. In particular, the write driver 220 comprises PMOS transistors M21 and M24, NMOS transistor M22, M23, M25 and M26, and an inverter 222. The transistors M21 and M22 are connected to form a first conventional inverter/driver 223. In particular, drains of the transistors M21 and M22 are connected together to form an output of the inverter/driver 223 while gates of the transistors M21 and M22 are connected together to form an input of the inverter/driver 223. The output of the inverter/driver 223 is connected through a pass transistor M25 to the BIT line. A gate of the pass transistor M25 is connected to and enabled by the WRITE input of the SRAM array 201. The input of the inverter/driver 223 is connected to an output of the inverter 222. A source of the transistor M21 in the inverter/driver 223 is connected to the supply voltage $V_{DD}$.

In a similar manner to the first inverter/driver 223, the transistors M24 and M23 are connected to form a second conventional inverter/driver 224. An output of the second inverter/driver 224 is connected through a pass transistor M26 to the inverse $\overline{BIT}$ line. A gate of the pass transistor M26 is connected to and enabled by the WRITE input of the SRAM array 201. Both an input of the inverter/driver 224 and an input of the inverter 222 are connected to a respective DATA input associated with the write driver 220. A source of the transistor M24 in the inverter/driver 224 is connected to the supply voltage $V_{DD}$.

The write driver 220 further comprises a bypass NMOS transistor M27 and a weak write pull-down NMOS transistor M28. A source of the transistor M22 of the first inverter/driver 223 and a source of the transistor M23 of the second inverter/driver 224 are connected together and connected to a source of the bypass transistor M27 and a source of the weak write pull-down transistor M28. A drain of each of the bypass transistor M27 and the weak write pull-down transistor M28 are connected to the second supply voltage $V_{SS}$ or ground. A gate of the bypass transistor M27 is connected to the inverse mode select $\overline{MS}$ input of the SRAM array 201. A gate of the weak write pull-down transistor M28 is connected to the output 102 of the PWWTM bias generator 100, 100' and receives output signal from the PWWTM bias generator 100, 100' output 102.

When operating in normal write mode (i.e., the WWTM is not asserted and MS='0', $\overline{MS}$='1'), both of the transistors M27 and M28 are turned ON. The bypass transistor M27 is turned ON by virtue of the application of the inverse mode select $\overline{MS}$ input. The weak write pull-down transistor M28 is turned ON by virtue of the default logic high '1' level of the output signal produced by the PWWTM bias generator 100, 100'. As a result, the drains of the transistors M22 and M23 are pulled down to essentially the second supply voltage $V_{SS}$ or ground.

Alternatively, when operating in the WWTM (i.e., WWTM is asserted and MS='1', $\overline{MS}$='0'), the bypass transistor M27 is turned OFF. In addition, the bias voltage $V_{bias}$ output signal produced by the PWWTM bias generator 100, 100' is applied to the gate of the weak write pull-down transistor M28. As a result of the weak write pull-down action of the transistor M28, a generally non-zero bias voltage will be present at the sources of the transistors M22 and M23. The presence of the non-zero bias voltage on the transistor M22, M23 sources causes the voltages produced by the inverter/drivers 223, 224 to fall short of normal logic voltage levels. Thus, a 'weak' logic signal is presented to the selected memory cell 210 by way of the pass transistors M25, M26.

An actual level of the non-zero bias voltage at the sources of the transistors M22 and M23 will depend on the size of the weak write pull-down transistor M28 and the selected magnitude of the bias voltage $V_{bias}$. In particular, by selecting a different one of the selectable magnitudes using the PWWTM bias generator 100, 100' array 110, as described above, an actual level of the non-zero bias voltage $V_{bias}$ may be increased or decreased. The operation or effective pull-down strength of the weak write pull-down transistor M28 is modulated by the selectable magnitude of the bias voltage $V_{bias}$ produced by the PWWTM bias generator 100, 100' according to the present invention.

Advantageously, manufacturing variations in a typical strength of the weak write pull-down transistor M28 may be accounted for by selecting a particular one of the available selectable magnitudes of the bias voltage $V_{bias}$. Such an ability to account for manufacturing variations in the strength of the transistor M28 may increase yields during manufacturing and decrease a number of design iterations needed to produce acceptable yields. In addition, the logic high '1' output signal produced by the PWWTM bias generator 100, 100' according to the present invention turns ON the weak write pull-down transistor M28 when the WWTM is not asserted. By turning ON the weak write pull-down transistor M28 in parallel with the bypass transistor M27 also being turned ON, according to the present invention, a write margin of the memory cell 210 may be improved. Advantageously, the improved write margin may also increase yields during manufacturing.

Figure 4:
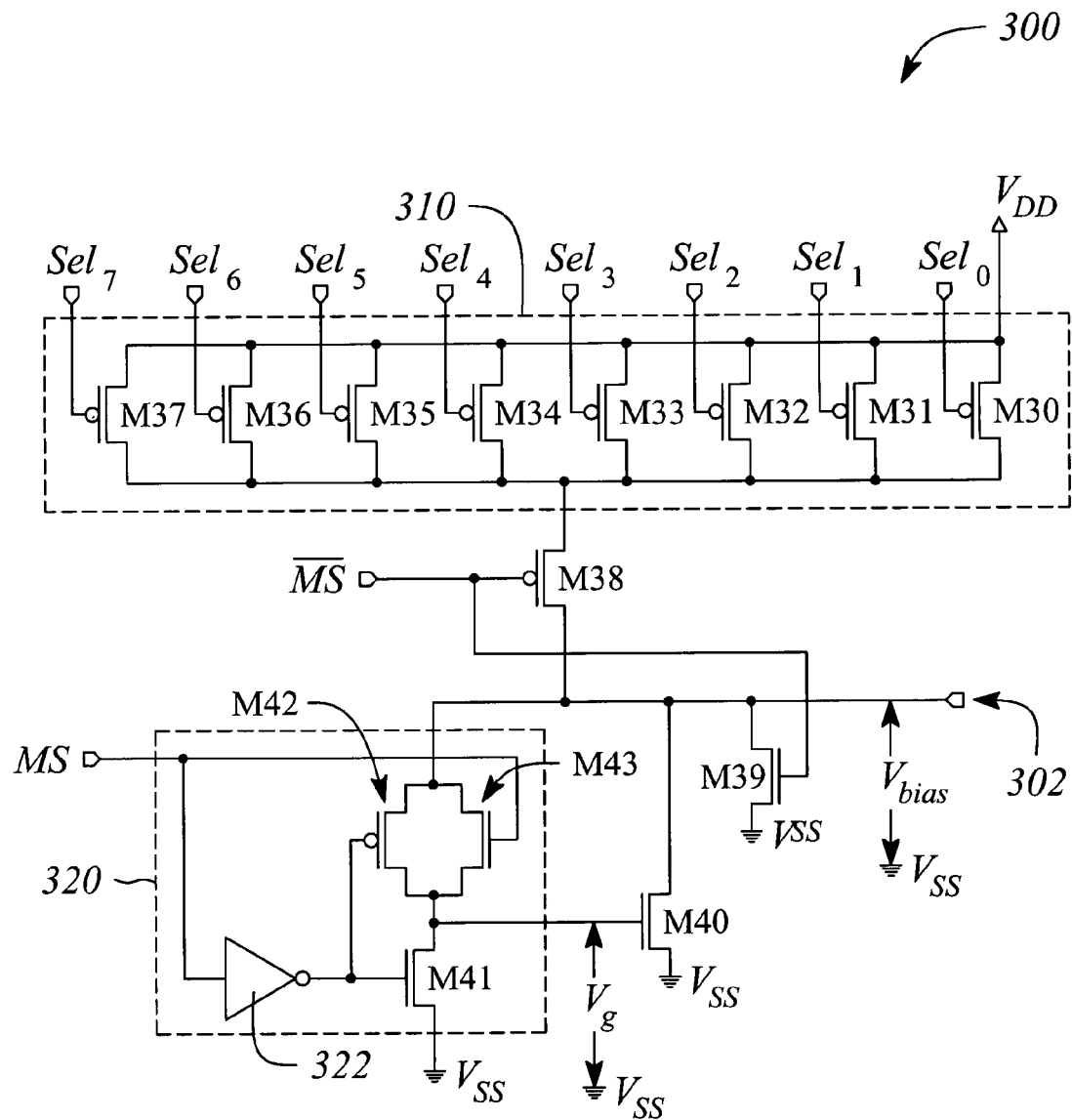
FIG. 4 illustrates a block diagram of a programmable weak write test mode (PWWTM) generator circuit known in the art.

FIG. 4 illustrates a programmable weak write test mode (PWWTM) generator circuit 300 known in the art. The PWWTM generator circuit 300 has a set of selection inputs $Sel_1$–$Sel_7$, a mode select $\overline{MS}$ input, an inverse mode select MS input, and an output 302. When the WWTM is asserted on the mode select MS input (i.e., MS='1' and $\overline{MS}$='0'), the PWWTM generator circuit 300 produces at the output 302 an output signal or a bias voltage $V_{bias}$ that has a selectable magnitude. The selectable magnitude is controlled by the selection inputs $Sel_1$–$Sel_7$. Note that in general for normal operation of the PWWTM generator circuit 300, $Sel_7$ is set equal to mode select MS (i.e., $Sel_7$=MS). When the WWTM is not asserted (i.e., MS='0', $Sel_7$='0', and $\overline{MS}$='1'), the PWWTM generator circuit 300 produces an output signal representing a logic low '0' level at the output 302. In other words, the PWWTM generator circuit 300 defaults to a logic low '0' output signal when the WWTM is not asserted.

The conventional PWWTM generator circuit 300 comprises an array 310 of PMOS transistors M30–M37. The source of each of the transistors M30–M37 is connected to the supply voltage $V_{DD}$. A gate of each of the transistors M30–M37 is connected to a different selection input of the set $Sel_0$–$Sel_7$. The transistor M30 is a smallest or weakest transistor of the array 310 having a relatively highest ON state resistance, while the transistor M37 is a largest or strongest transistor of the array 310 having a relatively lowest ON state resistance.

The conventional PWWTM generator circuit 300 further comprises a PMOS transistor M38 and an NMOS transistor M39. A source of the transistor M38 is connected to drains of each of the transistors M30–M37 of the array 310. A gate of the transistor M38 and a gate of the transistor M39 are connected to the inverse mode select $\overline{MS}$ input of the generator circuit 300. A drain of the transistor M38 and a drain of the transistor M39 are connected to the output 302 of the generator circuit 300. A source of the transistor M39 is connected to the supply voltage $V_{SS}$.

The conventional PWWTM generator circuit 300 further comprises a weak pull-down NMOS transistor M40. The weak pull-down transistor M40 has a drain connected to the output 302 and a source connected to the supply voltage $V_{SS}$ or ground. A gate of the weak pull-down transistor M40 is connected to an output of a gate bias circuit 320. The gate bias circuit 320 is essentially similar to the gate bias circuit 120 described hereinabove. In particular, the gate bias circuit 320 comprises an inverter 322, a pull-down NMOS transistor M41, a PMOS transistor M42, and an NMOS transistor M43. A drain of the transistor M41 is connected to the gate of the weak pull-down transistor M40 while a source of the transistor M41 is connected to the supply voltage $V_{SS}$. A source of the transistor M42 and a drain of the transistor M43 are connected together and connected to the output 302. A drain of the transistor M42 and a source of the transistor M43 are connected together and connected to the gate of the transistor M40. Together, transistors M42 and M43 form a transmission gate similar to transmission gate described with respect to the gate bias circuit 120 hereinabove. An output of the inverter 322 is connected to a gate of the pull-down transistor M41 and a gate of the transistor M42. An input of the inverter 322 and a gate of the transistor M43 are connected to an eighth selection input $Sel_7$. As noted hereinabove, the selection input $Sel_7$ functions as the mode select MS input.

When the WWTM is asserted (i.e., MS='1' and $\overline{MS}$='0'), the transistor M38 is turned ON and transistor M39 is turned OFF. The gate bias circuit 320 applies a gate voltage $V_g$ approximately equal to the bias voltage $V_{bias}$ to the gate of the weak pull-down transistor M40 that turns ON the transistor M40. The selectable magnitude of the bias voltage $V_{bias}$ output signal is controlled by selecting and turning ON one of the transistors M30–M37 using the selection inputs $Sel_0$–$Sel_7$. A resistive divider formed by an effective state resistance of the selected transistor M30–M37 of the array 310 in series with the ON state resistance of the transistor M39 and the ON state resistance of the weak pull-down transistor M40 determines the actual magnitude of the bias voltage $V_{bias}$ in a manner similar to that described hereinabove with respect to the bias generator 100, 100', but without a need for the transistor M39.

When the WWTM is not asserted (i.e., MS='0' and $\overline{MS}$='1'), the transistor M38 is turned OFF and the transistor M39 is turned ON. In addition, the gate bias circuit 320 insures that the weak pull-down transistor M40 is turned OFF. Since transistor M38 is OFF, no current can flow from the supply voltage $V_{DD}$ to the output 302. Furthermore, since transistor M39 is turned ON, a logic low '0' output signal approximately equal to the supply voltage $V_{SS}$ or ground is produced at the output 302.

In contrast to the PWWTM bias generator 100, 100' according to the present invention, the conventional PWWTM generator circuit 300 defaults to a logic low '0' output signal when WWTM is not asserted. In the SRAM system 200 illustrated in FIG. 3A, the conventional PWWTM generator circuit 300 in place of the PWWTM bias generator 100, 100' of the present invention will affect the SRAM array 201 in a nontrivial way. For example, when the conventional PWWTM generator circuit 300 defaults to the logic low '0' output signal, the weak write pull-down transistor M28 of the SRAM array write driver 220 is turned OFF by the PWWTM generator circuit 300. Thus, employing the PWWTM generator circuit 300 does not improve the write margin of the memory cell 210.

The conventional PWWTM generator circuit 300 also generally uses larger transistors than those used to implement the PWWTM bias generator 100, 100' according to the present invention. In particular, the presence of the series resistance of the transistor M38 in the conventional circuit 300 results in a need to increase sizes of the transistors M30–M37 in the array 310 relative to those in the array 110 of the present invention to achieve equivalent results with respect to the selectable magnitudes of the produced bias voltage $V_{bias}$. For example, if implementations of the bias generator 100 of the invention and the conventional generator circuit 300 having equivalent selectable magnitudes of the bias voltage $V_{bias}$ output signal are compared, a total length of array transistors M0–M7 is approximately one half a total length of the array transistors M30–M37.

Table 1 presents simulation results that compare relative transistor sizes (i.e., widths) for the array transistors M0–M7 and the array transistors M30–M37 of the PWWTM bias generator 100 and the conventional PWWTM generator circuit 300, respectively. Table 1 also includes a target failing resistance R associated with the weak write pull-down transistor M28 of the SRAM array write driver 220 to produce a failure of the memory cell 210 during WWTM testing and further includes a selected magnitude of the bias voltage $V_{bias}$ in volts produced by the bias generator 100 and conventional generator circuit 300 during WWTM testing.

TABLE 1

| Target Failing R | $V_{bias}$ (V) | Size (M0–M7) | Size (M30–M37) |
|---|---|---|---|
| 0 | 700K | 0.562 | 0.54 | 0.58 |
| 1 | 360K | 0.589 | 0.64 | 0.70 |
| 2 | 160K | 0.651 | 0.91 | 1.02 |
| 3 | 90K | 0.717 | 1.26 | 1.49 |
| 4 | 60K | 0.778 | 1.66 | 2.11 |
| 5 | 40K | 0.856 | 2.31 | 3.49 |
| 6 | 30K | 0.927 | 3.12 | 6.23 |
| 7 | 14K | 1.246 | 3.12 | 6.23 |

The transistor sizes (widths) presented in Table 1 are in microns and assume a gate length of 0.09 μm for the listed transistors. The simulation employed a 2.0/0.1 μm (width/length) for the transistor M28 and a 0.88/0.12 mm (width/length) for the transistor M40. According to the simulation results, a total width of the transistors M0–M7 is 13.56 μm, as opposed a total width of 21.85 μm for the transistors M30–M37. Thus, the PWWTM bias generator 100, 100' according to the present invention may be smaller and consume less IC real estate than the PWWTM generator circuit 300 known in the art.

Figure 5:
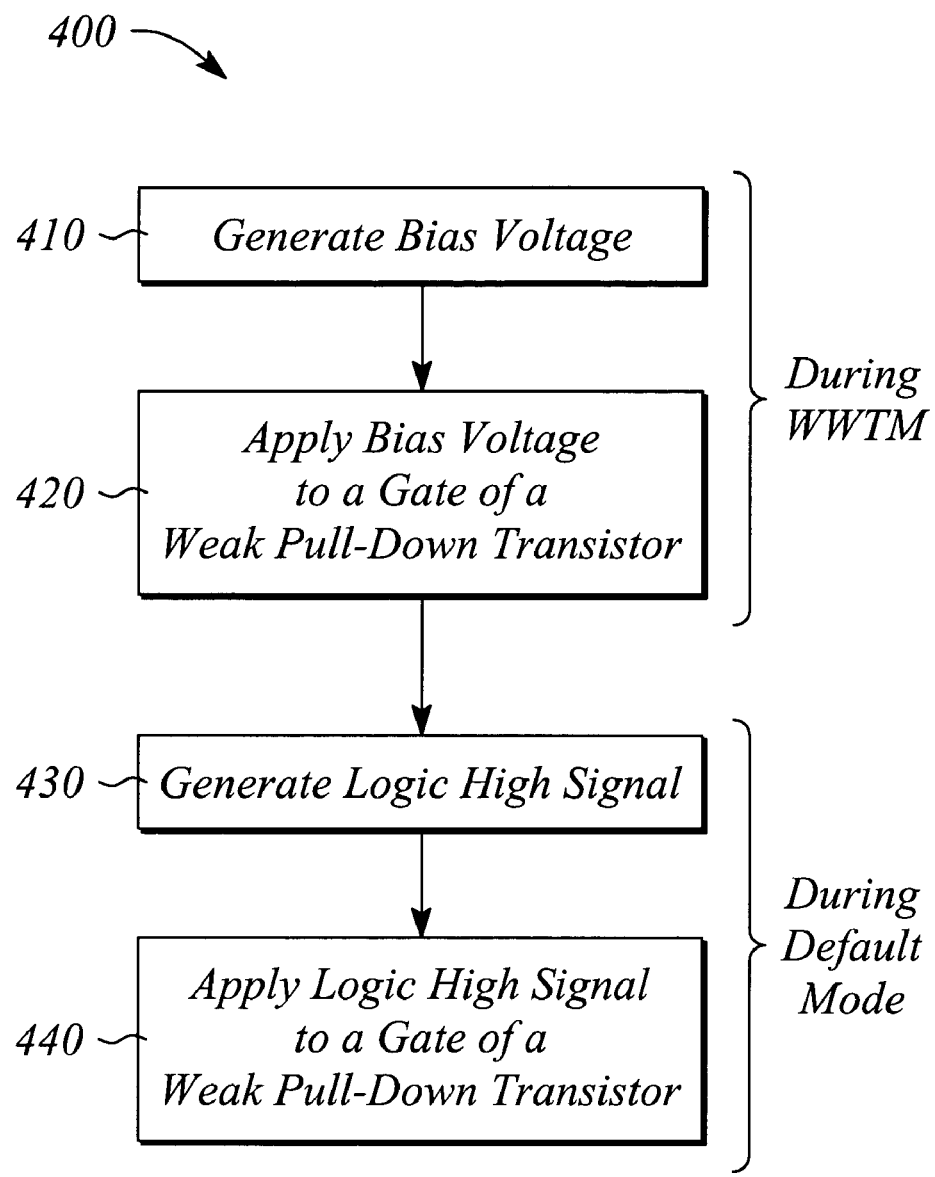
FIG. 5 illustrates a flow chart of a method of driving a WWTM-equipped SRAM according to an embodiment of the present invention.

FIG. 5 illustrates a flow chart of a method 400 of driving a weak write test mode (WWTM)-equipped static random access memory (SRAM) according to an embodiment of the present invention. The method 400 of driving comprises generating 410 a bias voltage having a selectable magnitude and applying 420 the generated bias voltage to a gate of a weak write pull-down transistor of a write driver while conducting a WWTM test of the SRAM. The weak write pull-down transistor is preferably a transistor between a ground connection of one or more inverters of the write driver and a circuit ground $V_{SS}$ of the SRAM. The selectable magnitude bias voltage modulates an effective 'ON' state resistance of the weak write pull-down transistor. By modulating the ON state resistance, a threshold of a detected memory cell failure may be adjusted. In particular, the threshold may be adjusted by selecting an appropriate magnitude from among the selectable magnitudes. The capability to adjust the threshold may be used to account for manufacturing related variations in the ON state resistance of the weak write pull-down transistor.

The method 400 further comprises generating 430 a logic high '1' output signal and applying 440 the logic high '1' signal to the gate of the weak write pull-down transistor while in a default mode or i.e., not conducting a WWTM test of the SRAM. The logic high signal '1' has a voltage that is sufficient to turn ON the weak write pull-up transistor. Preferably, the logic high signal '1' is essentially equal to a supply voltage $V_{DD}$. The application 440 of the logic high '1' signal insures that the weak write pull-down transistor is turned ON when the SRAM is operating in a normal mode (i.e., not conducting a WWTM test). Advantageously, the application 440 of the logic high '1' signal may improve a write margin of memory cells in the SRAM.

One or more of the following features and/or advantages may be realized by the present invention. The selectable magnitude or level of the output signal bias voltage may be used to account or compensate for process variations in the weak write pull-down transistor strength. In particular, the selectable magnitude bias voltage facilitates SRAM manufacturing by reducing a need for iterative design adjustments of the weak write pull-down transistor size. Thus, according to the present invention, sensitivity to weak write pull-down transistor sizing of the SRAM undergoing weak write testing is reduced. Furthermore, the default high-level output of the PWWTM bias generator 100, 100' according to the present invention may improve a write margin of the SRAM by biasing the weak write pull-down transistor to the ON state when WWTM is not activated. Moreover, since one PWWTM bias generator 100, 100' may be used to bias any number of weak write pull-down transistors in the SRAM, a cost in terms of circuit area for using the PWWTM bias generator 100, 100' is very small compared to a total circuit area of the SRAM.

Thus, there have been described a PWWTM bias generator 100, 100' and a WWTM-enabled SRAM system 200. In addition, a method 400 of driving a WWTM equipped SRAM is disclosed. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A programmable weak write test mode (PWWTM) bias generator for weak write test mode (WWTM) testing of a static random access memory (SRAM) comprising:
   generator circuit that generates an output signal at an output of the PWWTM bias generator, the output signal being a logic high signal in a default mode, and the output signal being a bias voltage having a selectable magnitude when in a WWTM, the selectable magnitude taking on a selectable one of a plurality of values different from a magnitude of the logic high signal.

2. The PWWTM bias generator of claim 1, wherein the generated output signal biases a gate of a weak write pull-down transistor of a write driver in the SRAM.

3. The PWWTM bias generator of claim 1, further comprising a mode select input that controls a selection between the WWTM and the default mode, a first supply voltage, a second supply voltage, and a set of selection inputs that control the selectable magnitude of the generated bias voltage in WWTM, wherein the second supply voltage is less than the first supply voltage, the second supply voltage optionally being zero volts or a ground voltage.

4. The PWWTM bias generator of claim 3, wherein when in the default mode, the logic high signal is approximately equal to the first supply voltage, the default mode logic high signal being actively maintained when the PWWTM bias generator output is connected to a load.

5. The PWWTM bias generator of claim 3, wherein the generator circuit comprises:
   an array of transistors connected such that a source of each array transistor is connected to the first supply voltage, a drain of each array transistor is connected to the PWWTM bias generator output, and a gate of each array transistor except for a gate of a last array transistor is connected to a different selection input of the set of selection inputs, the gate of the last array transistor being connected to the mode selection input;
   a pull-down transistor connected between the PWWTM bias generator output and the second supply voltage, and
   a gate bias circuit connected between the mode select input and a gate of the pull-down transistor,
   wherein the array transistors are p-type metal oxide semiconductor (PMOS) transistors that function to pull up the generated signal when in an ON state, the pull-down transistor being an n-type metal oxide semiconductor (MNOS) transistor that functions to pull down the generated signal to the second supply voltage when in the ON state.

6. A programmable weak write test mode (PWWTM) bias generator for static random access memory (SRAM) weak write test mode (WWTM) testing comprising:
an array of transistors connected in parallel between a first supply voltage and an output of the PWWTM bias generator;
a first pull-down transistor connected between the PWWTM bias generator output and a second supply voltage; and
a gate bias circuit that biases the first pull-down transistor connected between a mode select input and a gate of the first pull-down transistor,
wherein while in a default mode when WWTM is not active, an output signal at the PWWTM bias generator output is a logic high level signal, and
wherein while WWTM is active, the output signal at the PWWTM bias generator output is a bias voltage having a selectable magnitude.

7. The PWWTM bias generator of claim 6, wherein the transistors of the array are p-type metal oxide semiconductor (PMOS) array transistors, the first pull-down transistor being an n-type metal oxide semiconductor (NMOS).

8. The PWWTM bias generator of claim 6, wherein the transistors of the array are further connected to a set of selection inputs, a gate of each array transistor of the array being connected to a different selection input of the set except for a last array transistor, a gate of the last array transistor being connected to the mode select input, wherein each of the array transistors is individually selectable and individually activatable, such that a particular selection and activation of the array transistors selects a particular magnitude of the selectable magnitudes of the bias voltage.

9. The PWWTM bias generator of claim 8, wherein a particular magnitude selection comprises selecting one or more array transistors such that there are more selectable magnitudes than there are array transistors in the array.

10. The PWWTM bias generator of claim 6, wherein at least one array transistors of the array has a transistor size that differs from at least one other array transistor.

11. The PWWTM bias generator of claim 6, wherein the mode select input controls a selection between the WWTM and the default mode, and wherein the second supply voltage is less than the first supply voltage, the second supply voltage optionally being zero volts or a ground voltage.

12. The PWWTM generator of claim 6, wherein when in the default mode, the logic high level signal has a voltage level approximately equal to the first supply voltage, the default mode logic high level signal being actively maintained when the programmable WWTM bias generator output is connected to a load.

13. The PWWTM bias generator of claim 6, wherein the gate bias circuit comprises a second pull-down transistor connected between the first pull-down transistor gate and the second supply voltage, a p-type transistor connected to the first pull-down transistor gate, and an inverter connected between the mode select input and respective gates of the p-type transistor and the second pull-down transistor.

14. The PWWTM bias generator of claim 13, wherein the p-type transistor is further connected to the first supply voltage.

15. The PWWTM bias generator of claim 13, wherein the gate bias circuit further comprises an n-type transistor connected to the p-type transistor that also connects to the first pull-down transistor gate, the p-type transistor and the n-type transistor being further connected to the PWWTM bias generator output, a gate of the n-type transistor being further connected to the mode select input.

16. A weak write test mode (WWTM)-enabled static random access memory (SRAM) system comprising:
an SRAM array having a weak write pull-down transistor in a write driver; and
means for biasing the weak write pull-down transistor with a bias voltage, the bias voltage having a voltage equivalent to a logic high level of the SRAM in a default mode when the WWTM is not active, the bias voltage having a selectable magnitude when the WWTM is active.

17. The WWTM-enabled SRAM system of claim 16, wherein the selectable magnitude of the bias voltage compensates for variability in strength of the weak write pull-down transistor, such that sensitivity of the WWTM to sizing of the weak write pull-down transistor is reduced.

18. The WWTM-enabled SRAM system of claim 16, wherein the means for biasing comprises a programmable WWTM (PWWTM) bias generator circuit that comprises:
an array of transistors connected in parallel between a first supply voltage and an output of the PWWTM bias generator;
a generator pull-down transistor connected between the PWWTM bias generator output and a second supply voltage;
a gate bias circuit connected between a mode select input and a gate of the generator pull-down transistor, the gate bias circuit biasing the generator pull-down transistor; and
a set of selection inputs, a gate of each array transistor of the array being connected to a different selection input of the set except for a last array transistor, the gate of the last array transistor being connected to the mode select input,
wherein the logic high magnitude bias voltage in the default mode insures that the weak write pull-down transistor of the write driver is biased to an ON state.

19. The programmable WWTM-enabled SRAM system of claim 18, wherein the selectable magnitude of the bias voltage is selected by asserting one or more of the selection inputs of the set that activate respective one or more array transistors of the array.

20. A method of driving a weak write test mode (WWTM)-equipped static random access memory (SRAM) comprising:
generating a bias voltage and applying the generated bias voltage to a gate of a weak write pull-down transistor of a write driver while conducting a WWTM test of the SRAM; and
generating a logic high output signal and applying the logic high output signal to the gate of the weak write pull-down transistor while in a default mode when not conducting the WWTM test of the SRAM,
wherein the bias voltage has a selectable magnitude different from a magnitude of the logic high output signal.

21. The method of driving of claim 20, wherein the bias voltage selectable magnitude that modulates an effective ON state resistance of the weak write pull-down transistor, such that a threshold of a detected memory cell failure is adjustable by selecting a magnitude from among a plurality of selectable magnitudes.

22. The method of driving of claim 21, wherein the adjustable threshold is used to account for manufacturing related variations in the ON state resistance of the weak write pull-down transistor.

23. The method of driving of claim 20, wherein the logic high output signal has a voltage that is sufficient to activate an ON state of the weak write pull-down transistor, such that the weak write pull-down transistor is turned ON when the SRAM is operating in the default mode.

24. The method of driving of claim 20, wherein the application of the logic high output signal improves a write margin of memory cells in the SRAM.

* * * * *